United States Patent
Lee et al.

(10) Patent No.: US 9,540,539 B2
(45) Date of Patent: Jan. 10, 2017

(54) PRIMER COMPOSITION, METHOD OF FORMING A PRIMER LAYER ON A SEMICONDUCTOR DEVICE, AND METHOD OF ENCAPSULATING A SEMICONDUCTOR DEVICE

(71) Applicant: Infineon Technologies AG, Neubiberg (DE)

(72) Inventors: Swee Kah Lee, Melaka (MY); Joachim Mahler, Regensburg (DE); Chew Theng Tai, Melaka (MY); Yik Yee Tan, Melaka (MY); Soon Lock Goh, Melaka (MY); Poh Cheng Lim, Melaka (MY); Jagen Krishnan, Melaka (MY); Peh Hean Teh, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 14/287,231

(22) Filed: May 27, 2014

(65) Prior Publication Data

US 2015/0344730 A1    Dec. 3, 2015

(51) Int. Cl.
| | |
|---|---|
| *C09D 179/04* | (2006.01) |
| *H01L 23/29* | (2006.01) |
| *C09D 5/08* | (2006.01) |
| *C09D 163/00* | (2006.01) |
| *H01L 21/56* | (2006.01) |
| *C08G 14/06* | (2006.01) |
| *C09D 161/34* | (2006.01) |

(52) U.S. Cl.
CPC ............ *C09D 179/04* (2013.01); *C08G 14/06* (2013.01); *C09D 5/08* (2013.01); *C09D 161/34* (2013.01); *C09D 163/00* (2013.01); *H01L 21/565* (2013.01); *H01L 23/296* (2013.01); *H01L 2224/48091* (2013.01); *H01L 2224/48247* (2013.01); *H01L 2924/181* (2013.01)

(58) Field of Classification Search
CPC ....... C09D 5/08; C09D 161/34; C09D 163/00; C09D 179/04; C08G 14/06; H01L 23/296; H01L 21/565; H01L 2924/181; H01L 2224/48019; H01L 2224/48247
See application file for complete search history.

(56) References Cited

U.S. PATENT DOCUMENTS

| | | | | |
|---|---|---|---|---|
| 5,543,516 A | * | 8/1996 | Ishida | C08G 77/382 544/69 |
| 5,973,144 A | * | 10/1999 | Ishida | C07D 265/16 544/105 |
| 6,620,905 B1 | * | 9/2003 | Musa | C08G 73/06 525/203 |
| 6,905,590 B2 | * | 6/2005 | Nojiri | C09D 5/4457 205/317 |
| 8,389,758 B2 | | 3/2013 | Gorodisher et al. | |
| 8,410,202 B1 | * | 4/2013 | Wu | C08L 71/00 524/104 |
| 2003/0190477 A1 | | 10/2003 | Shi et al. | |
| 2009/0181165 A1 | * | 7/2009 | Liang | C08G 59/245 427/99.4 |

FOREIGN PATENT DOCUMENTS

JP           2003-12924 A  *  1/2003
WO      WO 2013/161088 A1 * 10/2013

* cited by examiner

*Primary Examiner* — Anthony J Green
(74) *Attorney, Agent, or Firm* — Viering, Jentschura & Partner mbB

(57) ABSTRACT

A primer composition is provided. The primer composition includes at least one bi- or multi-functional benzoxazine compound; and at least one compound including a functional group having affinity for a metallic surface, and a cross-linkable group. A method of forming a primer layer on a semiconductor device, and a method of encapsulating a semiconductor device are also provided.

14 Claims, 3 Drawing Sheets

(A)

(B)

(C)

(D)

Benzoxazine monomer on
Leadframe surface

Benzoxazine in mold
compound

Polybenzoxazine

PRIMER COMPOSITION, METHOD OF FORMING A PRIMER LAYER ON A SEMICONDUCTOR DEVICE, AND METHOD OF ENCAPSULATING A SEMICONDUCTOR DEVICE

TECHNICAL FIELD

Various embodiments relate generally to a primer composition, a method of forming a primer layer on a semiconductor device, and a method of encapsulating a semiconductor device.

BACKGROUND

Small electronic devices based on lead frames carrying microelectronic components, such as an integrated circuit (IC) chip, typically have exposed metal portions that are subject to oxidation and eventual corrosion. For example, lead frames may be constructed of copper, aluminum, nickel, a noble metal, or various ferrous alloys that are oxidizable to varying extent.

Typically, after manufacture, lead frames are treated with an anti-corrosion coating to inhibit corrosion prior to attachment of components to the lead frame. The anti-corrosion coatings, however, may present problems due to undesirable adhesion bonding of the microelectronic components to the lead frame. In cases where thermal bonding is used to manufacture the small electronic devices, the anti-corrosion coatings may delaminate from the coated surface, and/or chemically decompose, resulting in contamination of the microelectronic components. This affects processing efficiency due to extra time and efforts required for contaminants removal. Where contaminants cannot be removed, the products are scrapped, leading to lower product yields.

SUMMARY

Various embodiments provide a primer composition for semiconductor devices. The primer composition includes
  a) at least one bi- or multi-functional benzoxazine compound; and
  b) at least one compound including (i) a functional group having affinity for a metallic surface, and (ii) a cross-linkable group.

Various embodiments provide a method of forming a primer layer on a semiconductor device. The method includes
  A) providing a semiconductor device having a primer composition applied thereon, the primer composition including (a) at least one bi- or multi-functional benzoxazine compound; and b) at least one compound comprising (i) a functional group having affinity for a metallic surface, and (ii) a cross-linkable group; and
  B) curing the primer composition to form the primer layer.

Various embodiments provide a method of encapsulating a semiconductor device. The method includes
  A) applying a primer composition including (a) at least one bi- or multi-functional benzoxazine compound; and b) at least one compound comprising (i) a functional group having affinity for a metallic surface, and (ii) a cross-linkable group to a surface of at least one of a semiconductor device and a molding compound;
  B) arranging the molding compound on the semiconductor device such that at least a portion of the primer composition lies between and is in contact with the molding compound and the semiconductor device; and
  C) curing the primer composition under suitable conditions to cross-link the primer composition with the molding compound, thereby encapsulating the semiconductor device.

Various embodiments provide a molding composition including a primer composition. The primer composition includes
  a) at least one bi- or multi-functional benzoxazine compound; and
  b) at least one compound comprising (i) a functional group having affinity for a metallic surface, and (ii) a cross-linkable group.

Various embodiments provide a method for applying a primer composition on a substrate. The primer composition includes
  a) at least one bi- or multi-functional benzoxazine compound; and
  b) at least one compound comprising (i) a functional group having affinity for a metallic surface, and (ii) a cross-linkable group;
the method including mixing the primer composition with a molding composition, and applying the resultant mixture to a surface of the substrate.

BRIEF DESCRIPTION OF THE DRAWINGS

Various embodiments will be better understood with reference to the detailed description when considered in conjunction with the non-limiting examples and the accompanying drawings, in which:

In FIG. 1A, a chip 102 is arranged on a wirebond pad 106, which is in turn arranged on a lead frame 108. Bond wires 104 connect the chip 102 to the wirebond pad 106. The chip 102, bond wires 104, wirebond pad 106, and lead frame 108 make up the integrated circuit 100. The integrated circuit 100 is arranged on a tape 110. In FIG. 1B, a primer composition 120 is coated on the exposed areas of the chip 102, bond wires 104, wirebond pad 106, lead frame 108, and tape 110, which may be carried out via a spray or ultrasonic spray process. The primer composition 120 may be coated after wirebonding and prior to molding. Subsequently, a molding compound 112 is applied so as to encapsulate the integrated circuit 100, as shown in FIG. 1C, to form an integrated circuit package 150. The primer composition 120 may be cured after the molding compound 112 is applied. After hardening of the molding compound 112, the tape 110 is removed and the integrated circuit package 150 is transferred to a metal plate 114 as shown in FIG. 1D.

DETAILED DESCRIPTION

Figure 1:
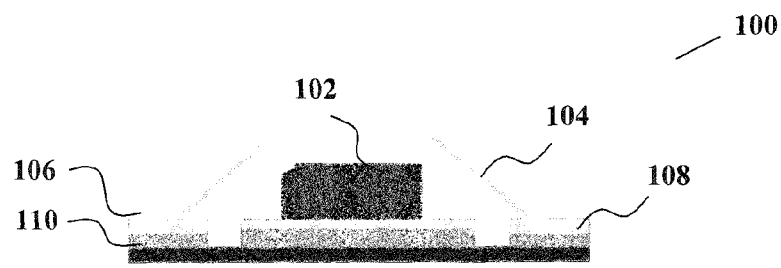
FIG. 1A to 1D are cross-sectional views of an integrated circuit package.
Figure 1:
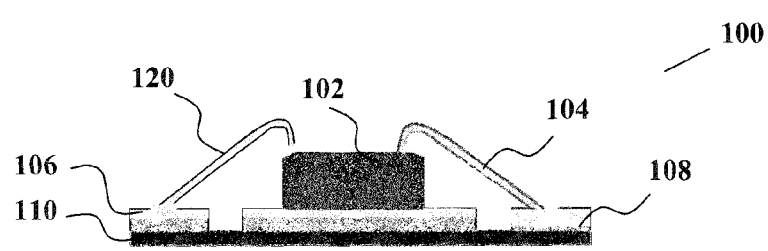
Figure 1:
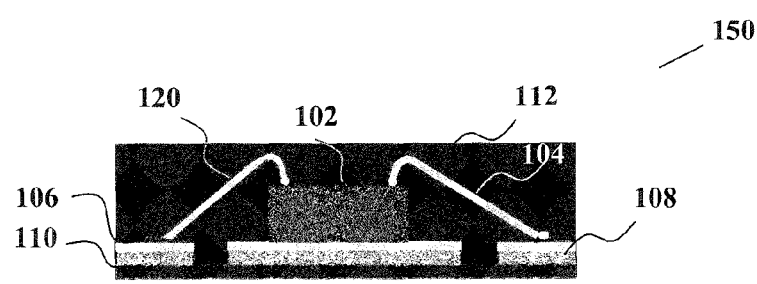
Figure 1:
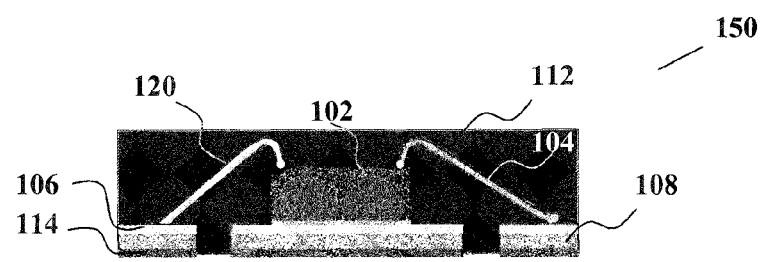
Figure 2:
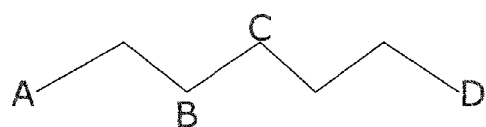
FIG. 2 is a schematic diagram of a primer layer having functionalities A, B, C, and D according to various embodiments. In various embodiments, A denotes a ligand for silver such as a carboxyl group; B denotes a ligand for tin such as an organophosphorous group and/or an amine group; C denotes a cross-linking group such as a silane group; and D denotes a benzoxazine group. The primer composition may include at least one compound containing D, and at least one compound containing A, B and/or C. Upon curing, a primer layer having the functionalities A, B, C, and D may be formed.
Figure 3:
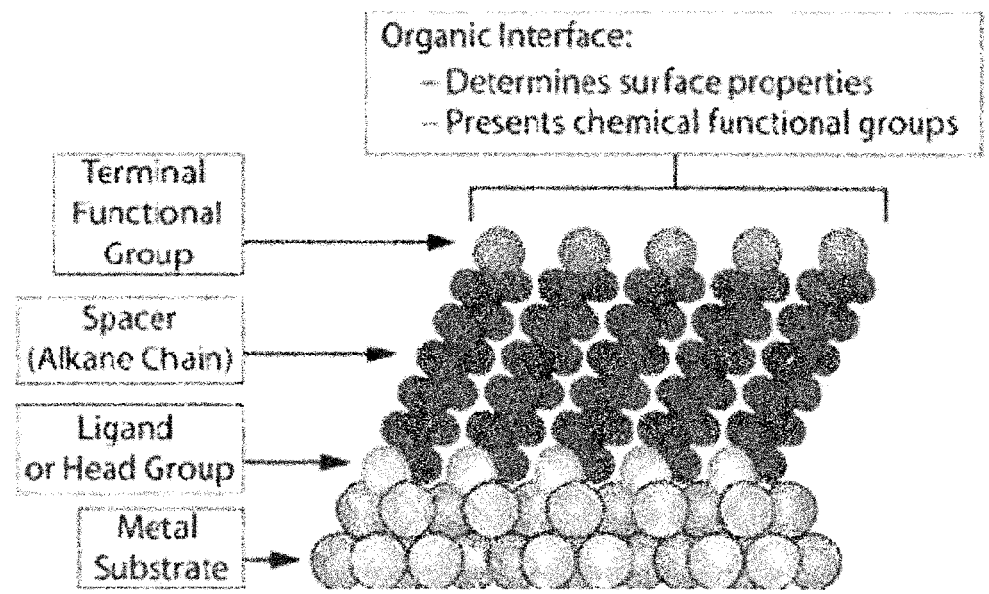
FIG. 3 is a schematic diagram of a primer layer on a metal substrate according to various embodiments. As shown, the primer layer is formed of an assembly of moieties including a ligand or a head group, a terminal functional group, and an alkyl spacer connecting the head group and the terminal functional group. The terminal functional group may function as an organic interface to determine surface properties of the primer layer. In specific embodiments, the terminal functional group also allows cross-linking reactions with the molding compound to be carried out.
Figure 4:
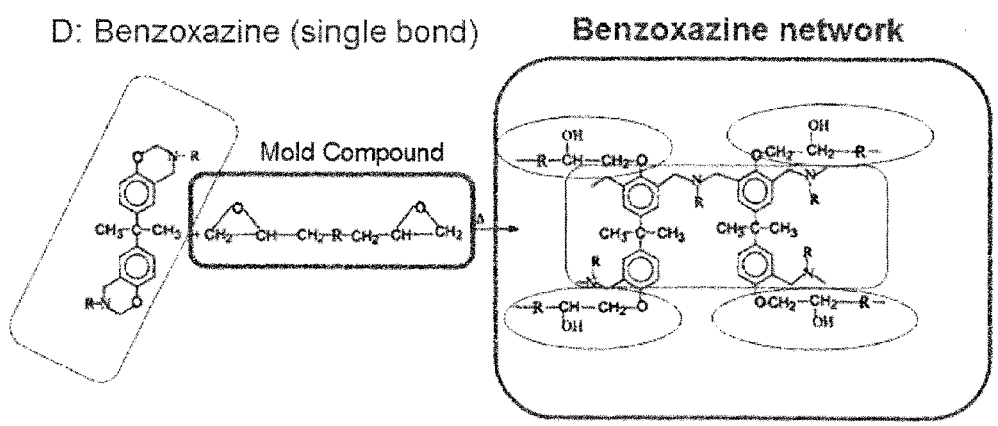
FIG. 4 is a schematic diagram showing reaction of benzoxazine in the primer composition with epoxy group in the molding compound to form a benzoxazine network. In so doing, a hydrophobic layer on the chip, bond wire, and/or lead frame surface where the primer composition is applied thereto may be formed. The hydrophobic layer may surround the chip, bond wire and/or lead frame to function as a corrosion protection layer over wire-bonded devices.
Figure 5:
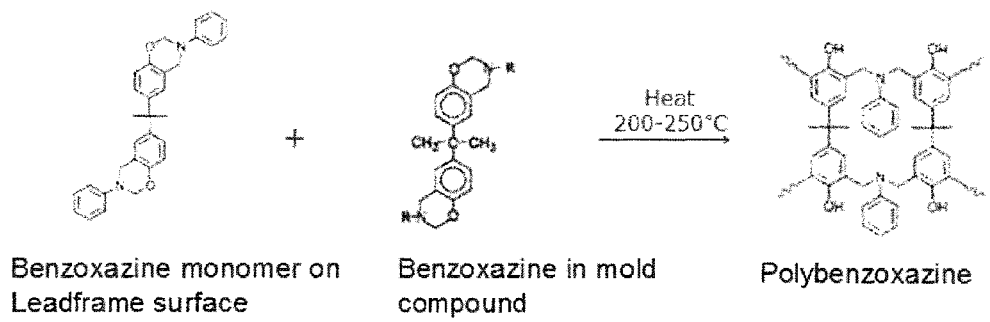
FIG. 5 is a schematic diagram showing polymerization of benzoxazine, which is present in the primer composition, and which may be present in the molding compound. In the embodiment shown, a primer composition disclosed herein is applied to a lead frame surface. The benzoxazine group on the lead frame surface reacts with benzoxazine present in the molding compound under application of heat, and at a temperature of about 200° C. to about 250° C. to form polybenzoxazine. This high temperature environment may be provided during storage, thereby inducing the self-polymerization process. In so doing, a hydrophobic layer on the chip, bond wire, and/or lead frame surface where the primer composition is applied thereto may be formed. The hydrophobic layer may surround the chip, bond wire and/or lead frame to function as an effective corrosion protection layer over wire-bonded devices.

Various embodiments provide a primer composition for semiconductor devices. The primer composition includes at least one bi- or multi-functional benzoxazine compound; and at least one compound including a functional group having affinity for a metallic surface, and a cross-linkable group.

The at least one bi- or multi-functional benzoxazine compound in the primer composition is capable of undergoing homopolymerization to form a primer layer made up of a coextensive mixture or polymer network of poly(benzoxazines). The primer layer may serve as a corrosion protection layer or a buffer coating layer, thereby protecting the underlying surface, in particular metallic portions of wire-bonded devices, from various damages. In various embodiments, the buffer coating layer may be formed at a lower curing temperature and involves less moisture absorption as compared to polyimide (PI) used in conventional methods.

The primer layer may additionally serve as an adhesion promoting layer, to enhance subsequent adhesion of a molding compound during semiconductor encapsulation. As the bi- and/or multi-functional benzoxazine compound in the primer composition is able to react with reactive groups, such as epoxy group and/or benzoxazine group, in the molding compound, this may provide improved thermal stability and moisture resistance for the underlying metallic elements that are prone to corrosion by moisture and/or oxygen.

In addition to the above, the primer composition may also be used to prevent electromigration of silver and copper during high temperature storage under bias condition. Package delamination during manufacturing, in particular, during pressure cooker test and high temperature storage, is prevented.

As used herein, the term "benzoxazine compound" refers to compounds or polymers having a benzoxazine ring of the formula

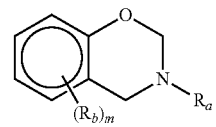

wherein $R_a$ and $R_b$ at each occurrence may be independently selected from the group consisting of an optionally substituted $C_1$-$C_{20}$ alkyl, optionally substituted $C_2$-$C_{20}$ alkenyl, optionally substituted $C_2$-$C_{20}$ alkynyl, optionally substituted monocyclic, condensed polycyclic or bridged polycyclic $C_5$-$C_{20}$ aryl, optionally substituted $C_3$-$C_{20}$ mono-, or poly-cycloalkyl, optionally substituted $C_3$-$C_{20}$ mono-, or poly-cycloalkenyl; optionally substituted 2-20-membered heteroalkyl, optionally substituted 2-20-membered heteroalkenyl, optionally substituted 2-20-membered heteroalkynyl, optionally substituted 5-20-membered monocyclic, condensed polycyclic or bridged polycyclic heteroaryl, optionally substituted 3-20-membered mono-, or poly-heterocycloalkyl, and optionally substituted 3-20-membered mono-, or poly-heterocycloalkenyl; and m is 0, 1, 2, 3, or 4.

The term "optionally substituted" refers to a group in which none, one, or more than one of the hydrogen atoms has been replaced with one or more substituent group(s) independently selected from a $C_{1-6}$ aliphatic group, hydroxy, alkoxy, cyano, F, Cl, Br, I, nitro, silyl, and amino, including mono- and di-substituted amino groups. As an example, an optionally substituted alkyl group means that the alkyl group may be substituted or unsubstituted. Exemplary substituents include $C_1$-$C_{10}$ alkoxy, $C_5$-$C_{10}$ aryl, $C_5$-$C_{10}$ aryloxy, sulfhydryl, $C_5$-$C_{10}$ arylthio, halogen, hydroxyl, amino, sulfonyl, nitro, cyano, and carboxyl.

The term "aliphatic", alone or in combination, refers to a straight chain or branched chain hydrocarbon including at least one carbon atom. Aliphatics include alkyls, alkenyls, and alkynyls. Aliphatics include, but are not limited to, methyl, ethyl, propyl, isopropyl, butyl, isobutyl, tert.-butyl, pentyl, hexyl, ethenyl, propenyl, butenyl, ethynyl, butynyl, propynyl, and the like, each of which may be optionally substituted.

The term "optionally substituted $C_1$-$C_{20}$ alkyl" refers to a fully saturated aliphatic hydrocarbon. The $C_1$-$C_{20}$ alkyl group may be straight chain or branched chain, and may be substituted or unsubstituted. Exemplary substituents have already been mentioned above. Whenever it appears here, a numerical range, such as 1 to 20 or $C_1$-$C_{20}$ refers to each integer in the given range, e.g. it means that an alkyl group includes only 1 carbon atom, 2 carbon atoms, 3 carbon atoms etc. up to and including 20 carbon atoms. Examples of alkyl groups may be, but are not limited to, methyl, ethyl, n-propyl, isopropyl, n-butyl, isobutyl, s-butyl, t-butyl, n-hexyl, n-heptyl, n-octyl, n-nonyl or n-decyl and the like.

The term "optionally substituted $C_2$-$C_{20}$ alkenyl" refers to an aliphatic hydrocarbon having one or more carbon-carbon double bonds. The $C_2$-$C_{20}$ alkenyl group may be straight chain or branched chain, and may be substituted or unsubstituted. $C_2$-$C_{20}$ alkenyl groups include, without limitation, vinyl, allyl, 1-propenyl, 1-butenyl, 2-butenyl, 3-butenyl, 2-methyl-1-propenyl, and 2-methyl-2-propenyl.

The term "optionally substituted $C_2$-$C_{20}$ alkynyl" refers to an aliphatic hydrocarbon having one or more carbon-carbon triple bonds. The $C_2$-$C_{20}$ alkynyl group may be straight chain or branched chain, and may be substituted or unsubstituted. Examples of alkynyl groups may be, but are not limited to, ethynyl, 1-propynyl, 2-propynyl, 1-butynyl, 2-butynyl, and 3-butynyl, and the like.

In the context of various embodiments, the term "optionally substituted $C_5$-$C_{20}$ aryl" refers to a group including an aromatic ring, wherein each of the atoms forming the ring is a carbon atom. Aromatic in this context means a group including a covalently closed planar ring having a delocalized π-electron system including 4w+2 π-electrons, wherein w is an integer of at least 1, for example 1, 2, 3 or 4. Aryl rings may be formed by 5, 6, 7, 8, 9, 10, 11, 12, 13, 14, 15, 16, 17, 18, 19 or 20 carbon atoms. The $C_5$-$C_{20}$ aryl may be substituted or unsubstituted. In various embodiments, such a group is a $C_5$-$C_{14}$ aryl, a $C_6$-$C_{12}$ aryl, a $C_6$ aryl, a $C_{10}$ aryl, a $C_{12}$ aryl, or a $C_{14}$ aryl.

The term "monocyclic aryl" refers to a monocyclic aromatic carbon ring. Examples of monocyclic aryl groups may be, but are not limited to, phenyl and the like. The term "condensed polycyclic aryl" refers to an aromatic carbon ring structure in which more than 1 monocyclic carbon rings are condensed or fused. Examples include naphthyl, anthracenyl, and phenanthryl. The term "bridged polycyclic aryl" refers to an aromatic carbon ring structure in which 1 aromatic carbon ring is connected to another aromatic carbon ring via a bridging group or atom, such as an alkyl group, O, S, or N, or via a direct bond. Examples include biphenyl, triphenyl, phenyl-naphthyl, binaphthyl, diphenyl ether, diphenyl sulphide, diphenyl disulphide, and the like.

In the context of various embodiments, by "$C_3$-$C_{20}$ cycloalkyl" is meant a group including a non-aromatic ring (i.e. an alicyclic ring) wherein each of the atoms forming the ring is a carbon atom. The $C_3$-$C_{20}$ cycloalkyl may be formed by three, four, five, six, seven, eight, nine, or more than nine carbon atoms including twenty carbon atoms. The $C_3$-$C_{20}$ cycloalkyl may be substituted or unsubstituted. The term "mono-cycloalkyl" refers to a mono-alicyclic ring. Examples of $C_3$-$C_{20}$ mono-cycloalkyl may include, but are not limited to, cyclopropane, cyclobutane, cyclopentane, cyclohexane, cycloheptane, and cyclooctane. The term "poly-cycloalkyl" refers to a carbon ring structure in which more than 1 mono-alicyclic carbon rings are fused or bridged. Examples include bicyclobutane, bicyclopentane, tricyclopentane, tricyclohexane, and tetracyclodecane.

In the context of various embodiments, by "$C_3$-$C_{20}$ cycloalkenyl" is meant a group including a non-aromatic ring (i.e. an alicyclic ring) wherein each of the atoms forming the ring is a carbon atom and contains one or more double bonds. The $C_3$-$C_{20}$ cycloalkenyl may be formed by three, four, five, six, seven, eight, nine, or more than nine carbon atoms including twenty carbon atoms. The $C_3$-$C_{20}$ cycloalkenyl may be substituted or unsubstituted. The term "mono-cycloalkenyl" refers to a mono-alicyclic ring which contains one or more double bonds. Examples of $C_3$-$C_{20}$ mono-cycloalkenyl include cyclopropene, cyclobutene, cyclopentene, cyclohexene, cycloheptene, cyclooctene, 1,3-cyclohexadiene, and 1,4-cyclohexadiene, among others. The term "poly-cycloalkenyl" refers to a carbon ring structure in which more than 1 mono-alicyclic carbon rings are fused or bridged, and the structure has one or more double bonds. Examples of $C_3$-$C_{20}$ poly-cycloalkenyl include bicyclobutene, bicyclopentene, tricyclopentene, tricyclohexene, and tetracyclodecene.

In the context of various embodiments, the term "heteroalkyl" refers to an alkyl wherein one or more carbon atoms are replaced by a heteroatom. The term "heteroatom" refers to an atom other than carbon present in a main chain of a hydrocarbon. Heteroatoms are typically independently selected from oxygen, sulfur, nitrogen, and phosphorus.

In line with the above, the term "heteroalkenyl" refers to an alkenyl wherein one or more carbon atoms are replaced by a heteroatom. The term "heteroalkynyl" refers to an alkynyl wherein one or more carbon atoms are replaced by a heteroatom.

The terms "1 to 20-membered" or "2 to 20-membered", refer to the number of straight chain or branched chain atoms including carbon and heteroatoms. In various embodiments, the number of straight chain or branched chain atoms for a 1-20-membered heteroalkyl is from 1-14, from 1-8, from 1-6, from 2-10, from 2-6, from 3-12, from 3-8, or from 4-10. In various embodiments, the number of straight chain or branched chain atoms for a 2-20-membered heteroalkenyl or a 2-20-membered heteroalkynyl is independently from 2-14, from 2-10, from 2-8, from 3-12, from 3-8, or from 4-10.

In the context of various embodiments, the terms "5-20-membered heteroaryl", has the general above definition of "$C_5$-$C_{20}$ aryl", except in that the heteroaryl is now termed as 5-20-membered, as 1 to 4 of the carbon atoms may be replaced by heteroatoms. Examples of heteroatoms have already been mentioned above. Examples of heteroaryl groups include, but are not limited to, furan, benzofuran, thiophene, benzothiophene, pyrrole, pyridine, indole, oxazole, benzoxazole, isoxazole, benzisoxazole, thiazole, benzothiazole, imidazole, benzimidazole, pyrazole, indazole, tetrazole, quinoline, isoquino line, pyridazine, purine, pyrazine, furazan, triazole, benzotriazole, pteridine, phenoxazole, oxadiazole, benzopyrazole, quinolizine, cinnoline, phthalazine, quinazoline or quinoxaline, and the like.

The terms "3-20-membered heterocycloalkyl" and "3-20-membered heterocycloalkenyl" have the general above definitions of "$C_3$-$C_{20}$ cycloalkyl" and "$C_3$-$C_{20}$ cycloalkenyl" respectively, except in the alicyclic ring at least one of the carbon atom in the ring is substituted with a heteroatom. The $C_3$-$C_{20}$ heterocycloalkyl or $C_3$-$C_{20}$ heterocycloalkenyl may be formed by three, four, five, six, seven, eight, nine, or more than nine atoms including twenty atoms. The $C_3$-$C_{20}$ heterocycloalkyls and $C_3$-$C_{20}$ heterocycloalkenyls may be substituted or unsubstituted. Examples of $C_3$-$C_{20}$ heterocycloalkyls and $C_3$-$C_{20}$ heterocycloalkenyls include, but are not limited to, lactams, lactones, cyclic imides, cyclic thioimides, cyclic carbamates, tetrahydrothiopyran, 4H-pyran, tetrahydropyran, piperidine, 1,3-dioxin, 1,3-dioxane, 1,4-dioxin, 1,4-dioxane, piperazine, 1,3-oxathiane, 1,4-oxathiane, tetrahydro-1,4-thiazine, 2H-1,2-oxazine, maleimide, succinimide, barbituric acid, thiobarbituric acid, dioxopiperazine, hydantoin, dihydrouracil, morpholine, trioxane, hexahydro-1,3,5-triazine, tetrahydrothiophene, tetrahydrofuran, pyrroline, pyrrolidine, pyrrolidone, pyrrolidione, pyrazoline, pyrazolidine, imidazoline, imidazolidine, 1,3-dioxole, 1,3-dioxolane, 1,3-dithiole, 1,3-dithiolane, isoxazoline, isoxazohdme, oxazoline, oxazolidine, oxazolidinone, thiazoline, thiazolidine, and 1,3-oxathiolane.

The term "halogen" or "halo" as used herein refers to fluorine, chlorine, bromine, or iodine.

Depending on the number of substitution on the phenyl ring, m may be 1, 2, 3, or 4.

A benzoxazine compound may be formed by reacting an amine with a phenol and formaldehyde. An example of the reaction scheme is shown in Scheme 1.

Scheme 1 Reaction of phenol with formaldehyde and amine to obtain benzoxazine

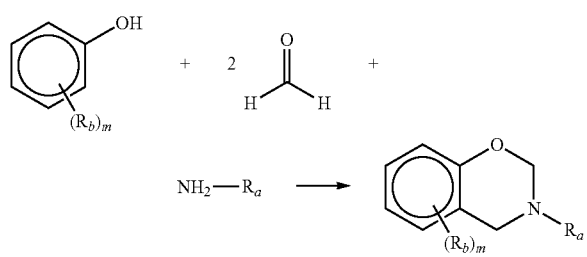

The primer composition includes at least one bi- or multi-functional benzoxazine compound. As used herein, the term "bi-functional benzoxazine compound" refers to a compound having two benzoxazine ring structures, while the term "multi-functional benzoxazine compound" refers to a compound having at least two benzoxazine ring structures. At least one bi-functional benzoxazine compound or at least one multi-functional benzoxazine compound is present in the primer composition. In some embodiments, the primer composition includes at least one bi-functional benzoxazine compound and at least one multi-functional benzoxazine compound. Upon application of heat, the benzoxazine ring structures may undergo a ring-opening polymerization process to form the respective polymer.

For example, the bi- and/or multi-functional benzoxazine compound may undergo homopolymerization, initiated by application of heat to the compound, to form a high molecular weight polymer.

The high molecular weight polymer that is formed may contain a phenolic type network. An example of the phenolic type network that is formed from the homopolymerization reaction of bi- and/or multi-functional benzoxazine compounds is shown below

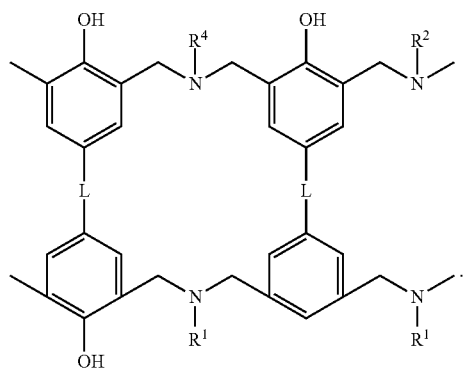

In various embodiments, the high molecular weight polymer is a thermosetting resin.

In various embodiments, the multi-functional benzoxazine compound has general formula (I)

$$L\text{-}(B)_n \qquad (I)$$

wherein B is a moiety containing a benzoxazine ring structure, n is 2, 3, or 4, L is a direct bond, or is a linking group selected from the group consisting of optionally substituted $C_1$-$C_{20}$ alkyl, optionally substituted $C_2$-$C_{20}$ alkenyl, optionally substituted $C_2$-$C_{20}$ alkynyl, optionally substituted monocyclic, condensed polycyclic or bridged polycyclic $C_5$-$C_{20}$ aryl, optionally substituted $C_3$-$C_{20}$ mono-, or poly- cycloalkyl, optionally substituted $C_3$-$C_{20}$ mono-, or poly- cycloalkenyl; optionally substituted 2-20-membered heteroalkyl, optionally substituted 2-20-membered heteroalkenyl, optionally substituted 2-20-membered heteroalkynyl, optionally substituted 5-20-membered monocyclic, condensed polycyclic or bridged polycyclic heteroaryl, optionally substituted 3-20-membered mono-, or poly-heterocycloalkyl, and optionally substituted 3-20-membered mono-, or poly-heterocycloalkenyl; —O—, —NR—, and —S—, wherein R is selected from the group consisting of H, optionally substituted $C_1$-$C_6$ alkyl and optionally substituted $C_5$-$C_{20}$ aryl.

Referring to formula (I), L may be a direct bond. For example, two benzoxazine moieties may be linked by a bond to form a multi-functional benzoxazine compound. Alternatively, L is a linking group connecting two or more benzoxazine moieties to form a multi-functional benzoxazine compound. Examples of L have already been mentioned above.

The linking group L may be attached to the respective benzoxazine moieties via the phenyl ring portion or via the oxazine ring portion. In various embodiments, the linking group L is attached to the respective benzoxazine moieties via the phenyl ring portion of the benzoxazine moiety.

Referring to formula (I), n may be 2. In such embodiments, the multi-functional benzoxazine compound may otherwise be termed as a bi-functional benzoxazine compound. The bi-functional benzoxazine compound may be represented by the formula B-L-B, where B and L are defined above.

In various embodiments, the multi-functional benzoxazine compound has general formula (II)

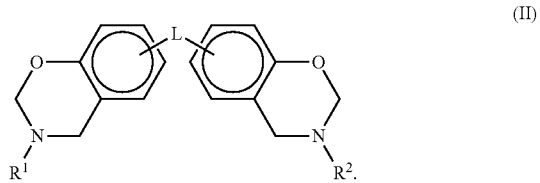

The linking group L has already been defined above. $R^1$ and $R^2$ are each independently selected from the group consisting of optionally substituted $C_1$-$C_6$ alkyl, optionally substituted $C_5$-$C_{20}$ aryl, hydroxy, alkoxy, cyano, halogen group, nitro, silyl, and amino groups.

The linking group L may be linked to the phenyl ring of the benzoxazine moieties at various positions on the phenyl ring. The position on the phenyl ring of the first benzoxazine moiety and the phenyl ring of the second benzoxazine moiety at which L is attached to may be the same or different. In specific embodiments, the multi-functional benzoxazine compound has the following structure

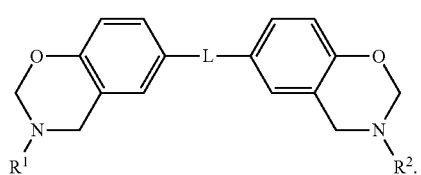

L may be selected from the group consisting of —C(CH$_3$)$_2$—, —CH$_2$—, —S—,

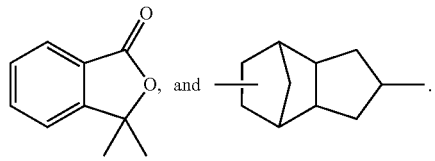

In specific embodiments, L is —C(CH$_3$)$_2$—.

R$^1$ and R$^2$ may be the same or different. In various embodiments, R$^1$ and R$^2$ are the same. In specific embodiments, at least one of R$^1$ and R$^2$ is

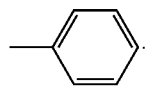

In various embodiments, the multi-functional benzoxazine compound is selected from the group consisting of

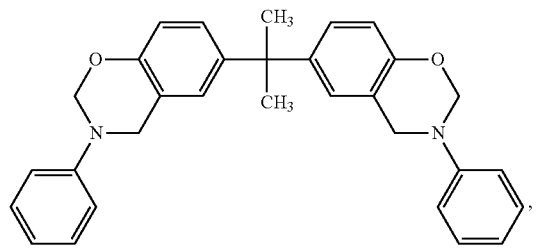

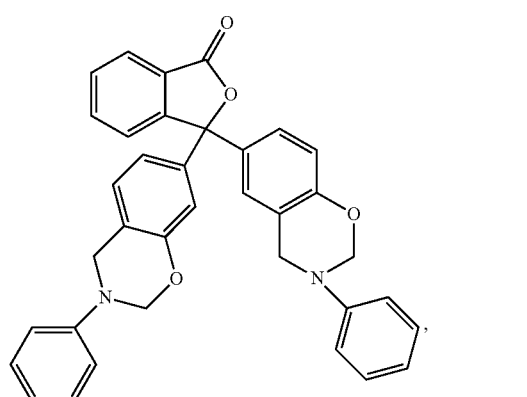

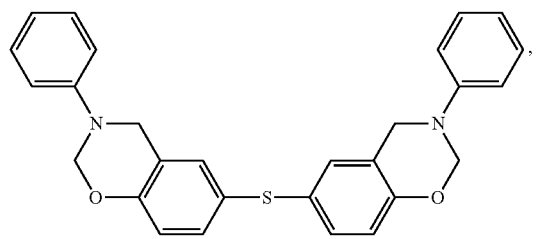

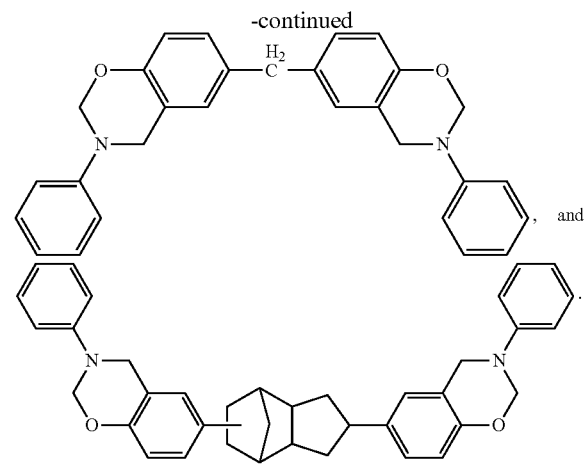

In specific embodiments, the multi-functional benzoxazine compound includes or essentially consists of

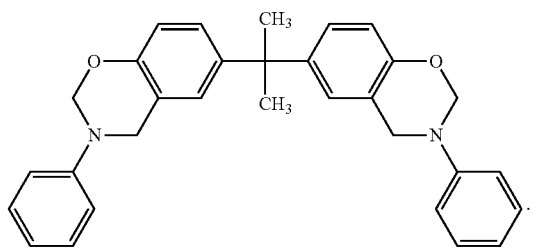

Advantageously, homopolymerization of the bi- and/or multi-functional benzoxazine compounds may be carried out with no or little weight loss and a low level of shrinkage during cure. The phenolic type network structure so formed has high glass transition temperature (Tg), low moisture absorption, improved flame resistance, high thermal oxidative resistance, and high char yield.

Apart from the at least one bi- or multi-functional benzoxazine compound, the primer composition also includes at least one compound including (i) a functional group having affinity for a metallic surface, and (ii) a cross-linkable group.

Generally, any functional group that allows attachment and/or bonding of the compound to the metallic surface may be used. For example, the functional group may be selected from the group consisting of a carboxy group, an epoxy group, an organophosphorous group, and an amine group.

The functional group having affinity for a metallic surface may be a functional group having affinity for at least one of silver and tin.

An example of a functional group having affinity for silver is a carboxyl group. As used herein, the term "carboxyl" refers to any group which contains a carbonyl group (C=O) wherein the carbonyl group is bonded to an anion so as to form a salt, or to a heteroatom, such as oxygen, nitrogen, sulfur, or halogen. A carboxyl group also includes the carboxylic acid form of carboxyl derivatives. Examples of a carboxyl group include, but are not limited to, an acyl halide, carboxylic acid, amide, ester, thiol ester, and mercaptocarbonyl. The carboxyl group is capable of attaching to a silver surface by coordination to the silver surface via its lone pair of electrons. In so doing, the compounds may be chemically bonded to the silver surface via the π system of the carboxyl group.

Examples of functional groups having affinity for tin include an organophosphorous group and an amine group. The term "organophosphorous" as used herein refers to organic compounds containing carbon-phosphorus bonds. Examples of organophosphorus compounds include triorganophosphines, diorganophosphines, organophosphones, triorganophosphites, triphenylphosphosphine, and the like.

Examples of compounds having an amine group include, but are not limited to, primary, secondary and tertiary amines, polymerized amino compounds and quaternary hydroxylammonium compounds. In various embodiments, the compound having an amine group may be aliphatic diamines such as ethylene diamine, trimethylene diamine, tetramethylene diamine, pentamethylene diamine, hexamethylene diamine, heptamethylene diamine, octamethylene diamine and nonamethylene diamine; polymerized aliphatic polyamines such as triethylene diamine, and tetraethylene triamine; aromatic amines such as aniline, N-methyl aniline, N,N-dimethyl aniline, and diamino benzene; cycloaliphatic amines such as piperidine; heterocylic amines such as pyridine; and compounds such as urea, thiourea, diphenyl urea and diphenyl thiourea.

The at least one compound including a functional group having affinity for a metallic surface also contains a cross-linkable group. The cross-linkable group serves as a means to couple the at least one bi- or multi-functional benzoxazine compound, with the at least one compound including a functional group having affinity for a metallic surface and a cross-linkable group.

Generally, the cross-linkable group may be any functional group that allows chemical reaction of the compounds to form a primer layer. Examples of cross-linkable groups include, but are not limited to, a sulfonyl group, a nitro group, a halogen group, a cyano group, hydroxy group, a carboxy group, an amine group, an epoxy group, an organosilicon group, and an isocyanate group.

In various embodiments, the cross-linkable group includes or essentially consists of an organosilicon group. As used herein, the term "organosilicon" refers to compounds having a carbon-silicon bond, such as compounds containing silane, siloxane, siloxide, or silyl halide groups.

In various embodiments, the cross-linkable group is a silane group. Examples of compounds containing a silane group include, but are not limited to, alkylalkoxysilanes such as methyltrimethoxysilane, methyltriethoxysilane, trimethylmonomethoxysilane; cyclic alkylsilanes such as cyclohexanetrimethoxysilane, alkylacetoxy silanes such as acetoxytrimethylsilane, phenylsilane, diphenylsilane, phenylmethylsilane, pentamethyldisiloxane, methylsilane, diethylsilane, aminoalkylsilane, mercaptoalkylsilane, and mixtures thereof.

The cross-linkable group may be connected with the functional group having affinity for a metallic surface via a linker group. For example, the cross-linkable group may be a terminal functional group. The terminal functional group may be connected to a linker group, which is in turn connected to the functional group having affinity for a metallic surface. In various embodiments, the linker group is a $C_1$-$C_8$ alkyl group.

The term "$C_{1-8}$ alkyl" refers to a fully saturated aliphatic hydrocarbon. The $C_1$-$C_8$ alkyl group may be straight chain or branched chain, and may be substituted or unsubstituted. Exemplary substituents have already been mentioned above. The $C_{1-8}$ alkyl group may contain 1 carbon atom, 2 carbon atoms, 3 carbon atoms etc. up to and including 8 carbon atoms. Examples of $C_{1-8}$ alkyl group groups include methyl, ethyl, n-propyl, isopropyl, n-butyl, isobutyl, s-butyl, t-butyl, n-hexyl, n-heptyl, and n-octyl.

Examples of compounds containing cross-linkable groups and functional groups having affinity for a metallic surface include, but are not limited to, (3-aminopropyl)trimethoxysilane and 5-epoxypentylisocyanate. In these molecules, the amino or the epoxy groups may act as the cross-linkable groups, while the silane or isocyanate groups may act as functional groups having affinity for a metallic surface, and may bond to a metallic surface. In the case of 5-epoxypentylisocyanate, the isocyanate group may additionally act as a cross-linkable group.

In various embodiments, the at least one bi- or multi-functional benzoxazine compound, and the at least one compound including (i) a functional group having affinity for a metallic surface, and (ii) a cross-linkable group are cross-linked with one another to form a single compound or copolymer network. The cross-linking may take place via the cross-linkable groups and the benzoxazine moieties.

For example, the cross-linkable group may be an epoxy group. The oxazine rings in the benzoxazine moieties may be cleaved to derive hydroxy groups, which in turn react with the epoxy groups in the compound to form a copolymer network. The type of cross-linking reaction may differ depending on the cross-linkable groups present. Other types of cross-linkable groups include, but are not limited to, an amino group and an isocyanate group.

In various embodiments, the functional group having affinity for a metallic surface may also take part in the cross-linking reaction to form the cross-linked compound. Accordingly, the functional group having affinity for a metallic surface may also act as cross-linkable groups, such as in the case of 5-epoxypentylisocyanate where the isocyanate group may serve as a functional group having affinity for a metallic surface and as a cross-linkable group. As a result of the cross-linking, the primer composition may possess compound having a carboxyl group, an amine group, a silane group, and a benzoxazine group. Accordingly, the primer composition may include a mixture of compounds having differing functional groups, benzoxazine moieties and/or cross-linkable groups.

The primer composition disclosed herein may be used as corrosion-resistant coatings and have application in, for example, electronics manufacturing where microelectronic components typically have exposed metal portions that are susceptible to oxidative corrosion. The primer composition may also be applied on an article such as a wafer to form a buffer coating layer. In its use as a buffer coating layer, as compared to polyimide (PI) which is the candidate of choice in conventional methods, the buffer coating layer may be formed at a lower curing temperature and involves less moisture absorption than PI.

Furthermore, various embodiments provide a method of forming a primer layer on a semiconductor device. The method includes providing a semiconductor device having a primer composition including (a) at least one bi- or multi-functional benzoxazine compound; and b) at least one compound comprising (i) a functional group having affinity for a metallic surface, and (ii) a cross-linkable group applied thereon.

The method includes curing the primer composition to form the primer layer. As mentioned above, the primer layer may serve as a corrosion protection layer or a buffer coating layer, thereby protecting the underlying surface, e.g. metallic portions of wire-bonded devices, from various damages.

In various embodiments, the primer layer is at least one of an adhesion promotion layer, a corrosion protection layer, and a buffer coating layer.

In various embodiments, curing the primer composition includes heating the primer composition at a temperature in the range of about 175° C. to about 250° C. For example, the primer composition may be heated at a temperature in the range of about 175° C. to about 225° C., about 175° C. to about 200° C., about 200° C. to about 250° C., about 225° C. to about 250° C., about 200° C. to about 225° C., about 175° C., or about 200° C.

By subjecting the primer composition to a temperature in the range of about 175° C. to about 250° C., the benzoxazine group in the primer composition may self-polymerize to form an anti-corrosion layer on the article. Besides using heat, other curing methods such as irradiation using ultraviolet light or addition curing may be used to cure the primer composition.

For example, the primer composition may include a photosensitive compound, or ultraviolet irradiation curable groups such as epoxy, such that the primer composition is rendered sensitive to ultraviolet light. By irradiating the primer composition including the photosensitive compound with ultraviolet light, the primer coating may be selectively cured.

In various embodiments, the primer composition may include an unsaturated group, such an alkenyl group or an alkynyl group. Presence of the unsaturated groups allows curing of the primer composition by addition curing to form the primer layer.

The method of the second aspect may include applying a molding compound to at least a portion of the primer composition prior to curing.

The term "molding compound" as used herein refers to materials used for encapsulating a semiconductor device. Molding compound generally includes two or more chemical components, which when combined and processed, hardens into a solid mass.

The molding compound may include or essentially consist of an epoxy resin. In various embodiments, the molding compound includes or essentially consists of a composition that forms an epoxy resin upon curing. For example, the molding compound may not be fully cured, and may include or essentially consist of a prepolymer or a monomer mixture containing epoxy groups.

In various embodiments, the molding compound comprises or essentially consists of an epoxy based molding compound. The epoxy based molding compound may comprise an epoxy component and a hardener component. In specific embodiments, the epoxy based molding compound may comprise an epoxy component and/or a hardener component selected from the group consisting of biphenyl, multiaromatic, multifunctional, novolac, ortho-cresol-novolac, and combinations thereof.

The molding compound may contain additives such as elastomers, flame retardants, curing agents, sealant, low stress agents such as silicon dioxide, fillers, catalysts and promoters. The molding compound also may include filler or bulking materials such as powdered glass, crushed silica, and spherical fused silica.

By applying the molding compound to the primer composition, with subsequent curing of the primer composition, the primer composition may be cross-linked with the molding compound. In various embodiments, the molding compound is not fully cured, thus upon application to the primer composition, the primer composition and the molding compound may be cured in parallel. In various embodiments, the cross-linking takes place via the benzoxazine group comprised in the primer composition with the respective functional groups in the molding compound.

The primer composition including the bi- and/or multi-functional benzoxazine compound may act as the adhesion promoter to enhance adhesion of the molding compound during semiconductor encapsulation. The term "adhesion promoter" as used herein refers to a material that improves or enhances affinity of two surfaces towards each other. For example, an adhesion promoter may be used to reinforce bonding strength of a molding compound to a semiconductor chip or lead frame. In various embodiments, the molding compound may further include an adhesion promoter. Examples of adhesion promoter include, but are not limited to, polyamides, epoxides, silanes, and benzoxazines.

As mentioned above, the molding compound may include an epoxy group, a benzoxazine group, or combinations thereof. As the bi- and/or multi-functional benzoxazine compound in the primer composition is able to react with reactive groups, such as epoxy group and/or benzoxazine group, in the molding compound, this provides improved thermal stability and moisture resistance for the underlying metallic elements that are prone to corrosion by moisture and/or oxygen.

The primer composition may be used in semiconductor manufacturing to function as an adhesion promoting layer, a corrosion protection layer and/or a buffer-coating layer. Examples of semiconductor devices may include, but are not limited to, a wafer, a wire-bond pad, a wire-bonded device, a semiconductor device, a wire, a lead frame, and a glue fillet.

Moreover, various embodiments provide a method of encapsulating a semiconductor device. The method includes applying a primer composition including (a) at least one bi- or multi-functional benzoxazine compound; and b) at least one compound comprising (i) a functional group having affinity for a metallic surface, and (ii) a cross-linkable group to a surface of at least one of a semiconductor device and a molding compound.

The primer composition may be applied on the semiconductor device and/or the molding compound by any suitable method, as will be understood by a person of ordinary skill in the art. In various embodiments, the primer composition is applied on the article by spray coating or ultrasonic spray coating.

The method includes arranging the molding compound on the semiconductor device such that at least a portion of the primer composition lies between and is in contact with the molding compound and the semiconductor device.

The primer composition is cured under suitable conditions to cross-link the primer composition with the molding compound, thereby encapsulating the semiconductor device.

Curing the primer composition may include heating the primer composition at a temperature in the range of about 175° C. to about 250° C. to cross-link the primer composition with the molding compound, thereby encapsulating the semiconductor device. Other suitable curing methods have already been discussed above.

In various embodiments, the mold compound includes or essentially consists of a composition that forms an epoxy resin upon curing. In various embodiments, the molding compound may further include an adhesion promoter, such as monomeric benzoxazines. Accordingly, the primer composition may be cross-linked with the epoxy group, benzoxazine group, or combinations thereof of the mold compound via the benzoxazine group comprised in the primer composition.

The primer composition may serve as an adhesion promoter to enhance adhesion of the molding compound during semiconductor encapsulation. As the bi- and/or multi-functional benzoxazine compound in the primer composition is able to react with reactive groups, such as epoxy group and/or benzoxazine group, in the molding compound, this provides improved thermal stability and moisture resistance for the underlying metallic elements that are prone to corrosion by moisture and/or oxygen.

Further, various embodiments provide a molding composition including a primer composition. The primer composition includes a) at least one bi- or multi-functional benzoxazine compound; and b) at least one compound comprising (i) a functional group having affinity for a metallic surface, and (ii) a cross-linkable group. For example, the primer composition may be dispersed in or admixed with the molding composition. Examples of primer composition and molding composition have already been described above.

In line with the above, various embodiments provide a method for applying a primer composition on a substrate. The primer composition includes a) at least one bi- or multi-functional benzoxazine compound; and b) at least one compound comprising (i) a functional group having affinity for a metallic surface, and (ii) a cross-linkable group. The method includes mixing the primer composition with a molding composition, and applying the resultant mixture to a surface of the substrate.

Hereinafter, various embodiments will be described more fully with reference to the accompanying drawings, in which various embodiments are shown. Various embodiments may, however, be embodied in many different forms and should not be construed as limited to the exemplary embodiments set forth herein. Rather, these embodiments are provided so that this disclosure will be thorough and complete, and will fully convey the scope of the embodiments to those skilled in the art. In the drawings, lengths and sizes of layers and regions may be exaggerated for clarity.

As used herein, the term "and/or" includes any and all combinations of one or more of the associated listed items. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The invention illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A primer composition for semiconductor devices, comprising
   (a) at least one bi- or multi-functional benzoxazine compound;
   (b) a functional group having affinity for a metallic surface, wherein the functional group is selected from the group consisting of a carboxy group, an organophosphorous group, an amine, and combinations thereof; wherein the carboxy group is selected from the group consisting of an acyl halide, a carboxylic acid, an amide, a thiol ester, a mercaptocarbonyl, and combinations thereof; wherein the amine is selected from the group consisting of an aliphatic diamine, a polymerized aliphatic polyamine, a N-methylaniline, a N,N-dimethyl aniline, a diamino benzene; a cycloaliphatic amine, a urea, a thiourea, a diphenyl urea, a diphenyl thiourea, and combinations thereof; and
   (c) a cross-linkable group selected from the group consisting of a sulfonyl group, a nitro group, a halogen group, a cyano group, a carboxy group, an amine group, an epoxy group, an organosilicon group, an isocyanate group, and combinations thereof; wherein the epoxy group is 5-epoxypentylisocyanate; wherein the amine is selected from the group consisting of an aliphatic diamine, a polymerized aliphatic polyamine, a N-methylaniline; a N,N-dimethyl aniline; a diamino benzene; a cycloaliphatic amine, a urea, a thiourea, a diphenyl urea, a diphenyl thiourea, and combinations thereof; wherein the organosilicon group is selected from the group consisting of a silane, a siloxane, a siloxide, a silyl halide, and combinations thereof; wherein the silane is selected from the group consisting of an alkylalkoxysilane, a cyclic alkylsilane, and combinations thereof; wherein the cross-linkable group couples the at least one bi-or multi-functional benzoxazine compound with the functional group having an affinity for a metallic surface; and wherein the cross-linkable group is different from the functional group.

2. The primer composition according to claim 1, wherein the multi-functional benzoxazine compound has general formula (I)

$$\text{L-(B)}_n \quad \text{(I)}$$

wherein

B is a benzoxazine moiety, n is 2, 3, or 4;

L is a direct bond, or is a linking group selected from the group consisting of optionally substituted $C_1$-$C_{20}$ alkyl, optionally substituted $C_2$-$C_{20}$ alkenyl, optionally substituted $C_2$-$C_{20}$ alkynyl, optionally substituted monocyclic, condensed polycyclic or bridged polycyclic $C_5$-$C_{20}$ aryl, optionally substituted $C_3$-$C_{20}$ mono-, or poly-cycloalkyl, optionally substituted $C_3$-$C_{20}$ mono-, or poly-cycloalkenyl; optionally substituted 2-20-membered heteroalkyl, optionally substituted 2-20-membered heteroalkenyl, optionally substituted 2-20-membered heteroalkynyl, optionally substituted 5-20-membered monocyclic, condensed polycyclic or bridged polycyclic heteroaryl, optionally substituted 3-20-membered mono-, or poly-heterocycloalkyl, and optionally substituted 3-20-membered mono-, or poly-heterocycloalkenyl; —O—, —NR—, and —S—, wherein R is selected from the group consisting of H, optionally substituted $C_1$-$C_6$ alkyl and optionally substituted $C_5$-$C_{20}$ aryl, and wherein L is attached to the benzoxazine moiety, preferably via the phenyl ring portion of the benzoxazine moiety.

3. The primer composition according to claim 2, wherein n is 2.

4. The primer composition according to claim 1, wherein the multi-functional benzoxazine compound has general formula (II)

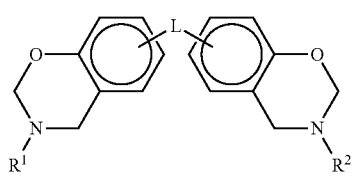

(I)

wherein L is a direct bond, or is a linking group selected from the group consisting of optionally substituted $C_1$-$C_{20}$ alkyl, optionally substituted $C_2$-$C_{20}$ alkenyl, optionally substituted $C_2$-$C_{20}$ alkynyl, optionally substituted monocyclic, condensed polycyclic or bridged polycyclic $C_5$-$C_{20}$ aryl, optionally substituted $C_3$-$C_{20}$ mono-, or poly-cycloalkyl, optionally substituted $C_3$-$C_{20}$ mono-, or poly-cycloalkenyl; optionally substituted 2-20-membered heteroalkyl, optionally substituted 2-20-membered heteroalkenyl, optionally substituted 2-20-membered heteroalkynyl, optionally substituted 5-20-membered monocyclic, condensed polycyclic or bridged polycyclic heteroaryl, optionally substituted 3-20-membered mono-, or poly-heterocycloalkyl, and optionally substituted 3-20-membered mono-, or poly-heterocycloalkenyl; —O—, —NR—, and —S—, wherein R is selected from the group consisting of H, optionally substituted $C_1$-$C_6$ alkyl and optionally substituted $C_5$-$C_{20}$ aryl; and wherein $R^1$ and $R^2$ are each independently selected from the group consisting Of optionally substituted $C_1$-$C_6$ alkyl, optionally substituted $C_5$-$C_{20}$ aryl, hydroxy, alkoxy, cyano, halogen group, nitro, silyl, and amino groups.

5. The primer composition according to claim 4, wherein L is selected from the group consisting of —C(CH$_3$)$_2$—, —CH$_2$—, —S—,

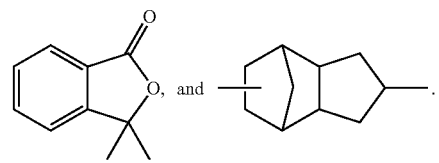

6. The primer composition according to claim 4, wherein at least one of $R^1$ and $R^2$ is

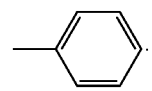

7. The primer composition according to claim 1, wherein the multi-functional benzoxazine compound is selected from the group consisting of

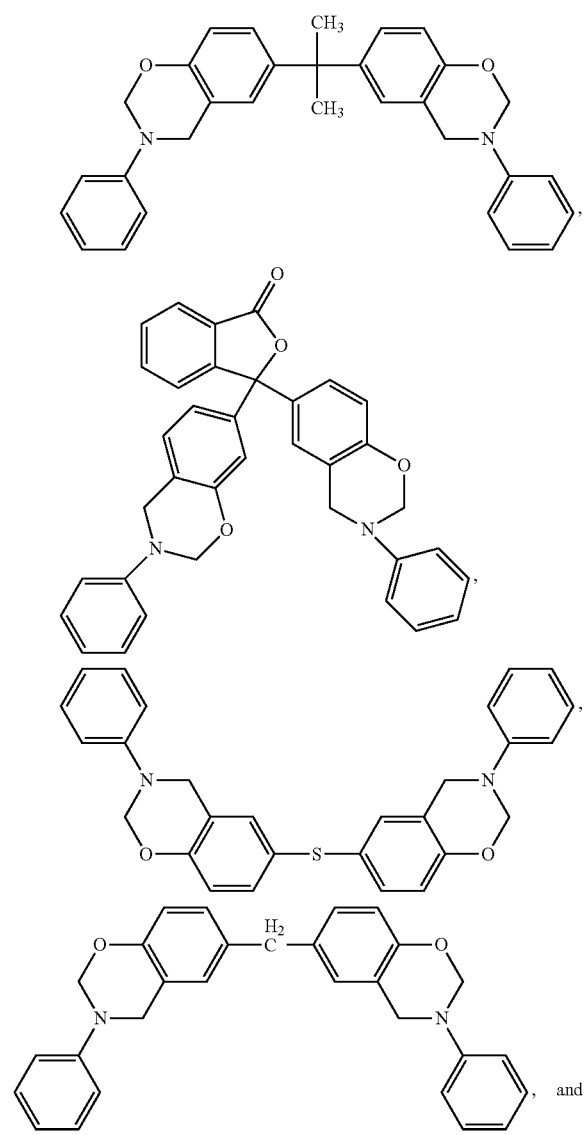

-continued

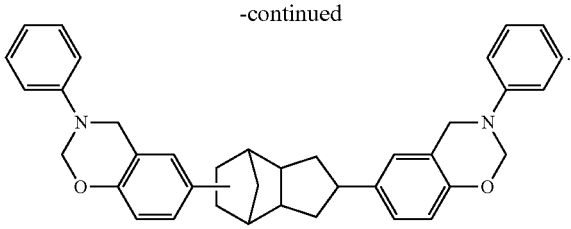

8. The primer composition according to claim 1, wherein the functional group having affinity for a metallic surface is a functional group having affinity for at least one of silver and tin.

9. The primer composition according to claim 1, wherein the functional group having affinity for a metallic surface is selected from the group consisting of a carboxy group, an epoxy group, an organophosphorous group, and an amine group.

10. The primer composition according to claim 1, wherein the cross-linkable group is selected from the group consisting of a sulfonyl group, a nitro group, a halogen group, a cyano group, hydroxy group, a carboxy group, an amine group, an epoxy group, an organosilicon group, and an isocyanate group.

11. The primer composition according to claim 10, wherein the organosilicon group comprises silane, siloxane, siloxide, or silyl halide.

12. The primer composition according to claim 1, wherein the functional group having affinity for a metallic surface and the cross-linkable group are connected via a $C_1$-$C_8$ alkyl linker.

13. The primer composition according to claim 1, wherein at least a portion of a) and b) are cross-linked with one another to form a single compound or copolymer network.

14. Molding composition comprising a primer composition, the primer composition comprising (a) at least one bi- or multi-functional benzoxazine compound;
(b) a functional group having affinity for a metallic surface, wherein the functional group is selected from the group consisting of a carboxy group, an organophosphorous group, an amine, and combinations thereof; wherein the carboxy group is selected from the group consisting of an acyl halide, a carboxylic acid, an amide, a thiol ester, a mercaptocarbonyl, and combinations thereof; wherein the amine is selected from the group consisting of an aliphatic diamine, a polymerized aliphatic polyamine, a N-methylaniline, a N,N-dimethyl aniline, a diamino benzene; a cycloaliphatic amine, a urea, a thiourea, a diphenyl urea, a diphenyl thiourea, and combinations thereof; and
(c) a cross-linkable group selected from the group consisting of a sulfonyl group, a nitro group, a halogen group, a cyano group, a carboxy group, an amine group, an epoxy group, an organosilicon group, an isocyanate group, and combinations thereof; wherein the epoxy group is 5-epoxypentylisocyanate; wherein the amine is selected from the group consisting of an aliphatic diamine, a polymerized aliphatic polyamine, a N-methylaniline; a N,N-dimethyl aniline; a diamino benzene; a cycloaliphatic amine, a urea, a thiourea, a diphenyl urea, a diphenyl thiourea, and combinations thereof; wherein the organosilicon group is selected from the group consisting of a silane, a siloxane, a siloxide, a silyl halide, and combinations thereof; wherein the silane is selected from the group consisting of an alkylalkoxysilane, a cyclic alkylsilane, and combinations thereof;

wherein the at least one bi- or multi-functional benzoxazine compound forms a benzoxazine network with the mold composition; and wherein the cross-linkable group is different from the functional group.

* * * * *